(12) United States Patent  
Kagayama et al.

(10) Patent No.: US 10,848,123 B2  
(45) Date of Patent: Nov. 24, 2020

(54) VIBRATION DEVICE

(71) Applicant: Murata Manufacturing Co., Ltd., Nagaokakyo (JP)

(72) Inventors: Kenji Kagayama, Nagaokakyo (JP); Takahiro Nishii, Nagaokakyo (JP); Hiroaki Obara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 565 days.

(21) Appl. No.: 15/865,814

(22) Filed: Jan. 9, 2018

(65) Prior Publication Data

US 2018/0131346 A1    May 10, 2018

Related U.S. Application Data

(63) Continuation of application No. PCT/JP2017/001012, filed on Jan. 13, 2017.

(30) Foreign Application Priority Data

Jan. 29, 2016  (JP) ................ 2016-016128

(51) Int. Cl.
  *H03H 9/09*    (2006.01)
  *H03H 9/10*    (2006.01)
  (Continued)

(52) U.S. Cl.
  CPC ............ *H03H 9/09* (2013.01); *B06B 1/0666* (2013.01); *H01L 41/094* (2013.01); *H03H 9/10* (2013.01);
  (Continued)

(58) Field of Classification Search
  CPC ............ H03H 9/09; H03H 9/10; H03H 9/176; H03H 9/13; H01L 41/1876; H01L 41/094; B06B 1/0666
  See application file for complete search history.

(56) References Cited

U.S. PATENT DOCUMENTS

| 5,796,152 A | 8/1998 | Carr et al. |
| 8,247,954 B2 | 8/2012 | Kagayama et al. |

(Continued)

FOREIGN PATENT DOCUMENTS

| CN | 104702145 A | 6/2015 |
| JP | H10272418 A | 10/1998 |

(Continued)

OTHER PUBLICATIONS

International Search Report issued for PCT/JP2017/001012, dated Mar. 7, 2017.

(Continued)

*Primary Examiner* — J. San Martin  
(74) *Attorney, Agent, or Firm* — Arent Fox LLP

(57) ABSTRACT

A vibration device is provided with reduced thickness and size while maintaining vibration strength. The vibration device includes a first elastic plate with first and second ends and a first planar section disposed between the first and second ends. Moreover, a second elastic plate is joined to the second end of the first elastic plate and includes a second planar section opposing the first planar section of the first elastic plate. The second elastic plate has a flexural rigidity that is higher than that of the first elastic plate. In addition, a piezoelectric vibrating element is disposed on in the first planar section of the first elastic plate to face the second elastic plate. A weight can be attached to the first end of the first elastic plate to facilitate vibration.

20 Claims, 6 Drawing Sheets

(51) Int. Cl.
  *B06B 1/06* (2006.01)
  *H01L 41/09* (2006.01)
  *H03H 9/13* (2006.01)
  *H03H 9/17* (2006.01)
  *H01L 41/187* (2006.01)

(52) U.S. Cl.
  CPC .............. *H03H 9/13* (2013.01); *H03H 9/176* (2013.01); *H01L 41/1876* (2013.01)

(56) References Cited

U.S. PATENT DOCUMENTS

| | | |
|---|---|---|
| 8,513,858 B2 | 8/2013 | Kagayama et al. |
| 9,931,671 B2 * | 4/2018 | Choi ..................... B06B 1/0648 |
| 10,639,676 B2 * | 5/2020 | Kagayama ............ B06B 1/0644 |
| 2011/0095649 A1 | 4/2011 | Kagayama et al. |
| 2011/0140574 A1 | 6/2011 | Kagayama et al. |
| 2015/0158184 A1 | 6/2015 | Kamijo et al. |
| 2017/0028441 A1 | 2/2017 | Kagayama et al. |
| 2018/0029078 A1 * | 2/2018 | Park ..................... H01L 41/0477 |
| 2019/0240697 A1 * | 8/2019 | Kagayama ............ B06B 1/0644 |

FOREIGN PATENT DOCUMENTS

| | | |
|---|---|---|
| JP | H11313395 A | 11/1999 |
| JP | 2006157226 A | 6/2006 |
| WO | 2009141970 A1 | 11/2009 |
| WO | 2010023801 A1 | 3/2010 |
| WO | 2011021548 A1 | 2/2011 |
| WO | 2015163166 A1 | 10/2015 |

OTHER PUBLICATIONS

Written Opinion of the International Searching Authority issued for PCT/JP2017/001012, dated Mar. 7, 2017.

* cited by examiner

VIBRATION DEVICE

CROSS REFERENCE TO RELATED APPLICATIONS

The present application is a continuation of PCT/JP2017/001012 filed Jan. 13, 2017, which claims priority to Japanese Patent Application No. 2016-016128, filed Jan. 29, 2016, the entire contents of each of which are incorporated herein by reference.

TECHNICAL FIELD

The present disclosure relates to a vibration device in which a piezoelectric vibrating element is fixed to an elastic plate such as a metal plate.

BACKGROUND

Various vibration devices exist for the purpose of notifying an incoming call. For example, Patent Literature (identified below) discloses an example of such a vibration device. The vibration device described in Patent Literature 1 includes an elastic plate obtained by bending a metal plate to have a U shape when viewed from a side. One side of the elastic plate is formed as a tabular fixed section and the other side of the elastic plate is formed as a tabular vibrating section with a bent section therebetween. Moreover, a piezoelectric vibrating plate is provided in the vibrating section.
Patent Literature 1: WO 2010/023801.

In this type of vibration device, a further reduction in size and thickness is demanded according to a reduction in the sizes of mounted components resulting from a reduction in the sizes and improvement of the functions of electronic devices and the like. As a result, the strength of vibration tends to be low due to the reduction in size and thickness of the vibration device.

SUMMARY OF THE INVENTION

It is an object of the present disclosure to provide a vibration device having a reduction in thickness and size less easily occurs, but with less of a decrease of vibration strength compared with conventional designs.

Accordingly, a vibration device is disclosed that a first elastic plate including first and second ends and a first planar section located between the first and second ends. Moreover, a second elastic plate is joined to the second end of the first elastic plate and includes a second planar section opposing the first planar section of the first elastic plate. The second elastic plate has a flexural rigidity that is higher than flexural rigidity of the first elastic plate. Moreover, a piezoelectric vibrating element is provided on a surface on a second elastic plate side in the first planar section of the first elastic plate; and a weight is attached to the first end of the first elastic plate.

In a certain specific aspect of the exemplary vibration device, the vibration device further includes a package member provided to house the first elastic plate to which the piezoelectric vibrating element and the weight are attached. In this case, it is possible to increase the strength of the vibration device.

In another specific aspect of the exemplary vibration device, the vibration device further includes a circuit section provided on a surface on the second planar section of the second elastic plate to face the first elastic plate and forming at least a part of a circuit for driving the piezoelectric vibrating element.

In still another specific aspect of the exemplary vibration device, the thickness of the second elastic plate is larger than thickness of the first elastic plate. In this case, the flexural rigidity of the second elastic plate can effectively be increased relative to the first elastic plate.

In another specific aspect of the exemplary vibration device, a material of the second elastic plate has a flexural rigidity that is higher than flexural rigidity of a material of the first elastic plate. In this case, the flexural rigidity of the second elastic plate can effectively be increased relative to the first elastic plate.

In still another specific aspect of the exemplary vibration device, the first elastic plate includes a first joining section joined to the second elastic plate and a first linking section that links the first joining section and the first planar section. Moreover, the first joining section is located farther on the second end than the first linking section, and the first elastic plate is bent towards the second elastic plate in the first linking section.

In still another specific aspect of the exemplary vibration device, the first joining section extends from the first linking section in a direction away from the first end, and the first joining section includes a surface extending in parallel to the second planar section of the second elastic plate and is joined to the second elastic plate on the surface. In this case, size of the vibration device can be further reduced.

In still another specific aspect of the exemplary vibration device, the first joining section extends from the first linking section in a direction approaching the first end, and the first joining section includes a surface extending in parallel to the second planar section of the second elastic plate and is joined to the second elastic plate on the surface.

In still another specific aspect of the exemplary vibration device, the second elastic plate includes third and fourth ends, a second joining section in which the second elastic plate is joined to the first elastic plate, and a second linking section that links the second joining section and the second planar section. Moreover, the second planar section is located between the third and fourth ends, the second joining section is located farther on the fourth end than the second linking section, and the second elastic plate is bent towards the first elastic plate in the second linking section.

In still another specific aspect of the exemplary vibration device, the second joining section extends from the second linking section in a direction away from the third end, and the second joining section includes a surface extending in parallel to the first planar section of the first elastic plate and is joined to the first elastic plate on the surface.

In still another specific aspect of the exemplary vibration device, the second joining section includes the fourth end, the fourth end includes an end face of the second elastic plate, and the second joining section is joined to the first elastic plate on the end face. In this case, it is possible to reduce a joining area of the first elastic plate and the second elastic plate. Therefore, it is possible to further reduce the size of the vibration device.

In still another aspect of the exemplary vibration device, the second elastic plate includes third and fourth ends and a projecting section projecting to the first elastic plate side on the fourth end, with the projecting section jointed to the first elastic plate. In this case, it is possible to increase an area of contact of the second elastic plate with a target on which the vibration device is mounted. Therefore, it is possible to efficiently propagate vibration to the outside.

In still another specific aspect of the exemplary vibration device, the thickness of the projecting section is the same as thickness of at least a part of other than the projecting section in the second elastic plate. Moreover, a portion where the projecting section is formed is a concave section opened to a surface on an opposite side of the first elastic plate side of the second elastic plate.

In still another specific aspect of the exemplary vibration device, the projecting section includes the fourth end of the second elastic plate. In this case, it is possible to further reduce the size of the vibration device.

In still another specific aspect of the exemplary vibration device, the thickness of the second planar section of the second elastic plate is smaller than thickness of a portion where the second elastic plate is coupled to the first elastic plate. In this case, the weight much less easily collides with the second elastic plate. Therefore, a decrease in the strength of vibration can be minimized during a reduction in thickness and size of the vibration device.

In still another specific aspect of the exemplary vibration device, the second elastic plate includes third and fourth ends, and a portion where the first elastic plate and the second elastic plate are joined includes at least one of the second end of the first elastic plate and the fourth end of the second elastic plate. In this case, it is possible to further reduce the size of the vibration device.

In still another specific aspect of the exemplary vibration device, a direction connecting the first and second ends of the first elastic plate is a longitudinal direction of the first elastic plate.

In still another specific aspect of the exemplary vibration device, the first and second elastic plates are made of metal. In this case, it is possible to prevent a decrease in the strength of vibration in the first and second elastic plates.

According to the present disclosure, it is possible to provide a vibration device having a reduction in thickness and size, but with minimal decrease in vibration strength compared with conventional designs.

DETAILED DESCRIPTION OF EXEMPLARY EMBODIMENTS

Figure 1:
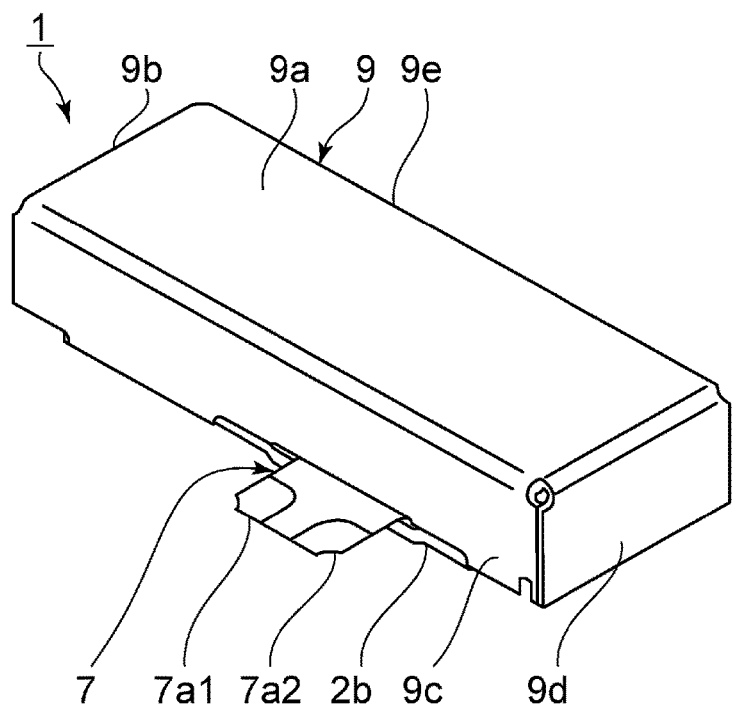
FIG. 1 is a perspective view of a vibration device according to a first exemplary embodiment.

The present disclosure is clarified by explaining specific exemplary embodiments below while referring to the drawings.

It is noted that the exemplary embodiments described below are illustrative and partial substitution or combination of components is possible among different embodiments as would be appreciated to one skilled in the art.

Figure 2:
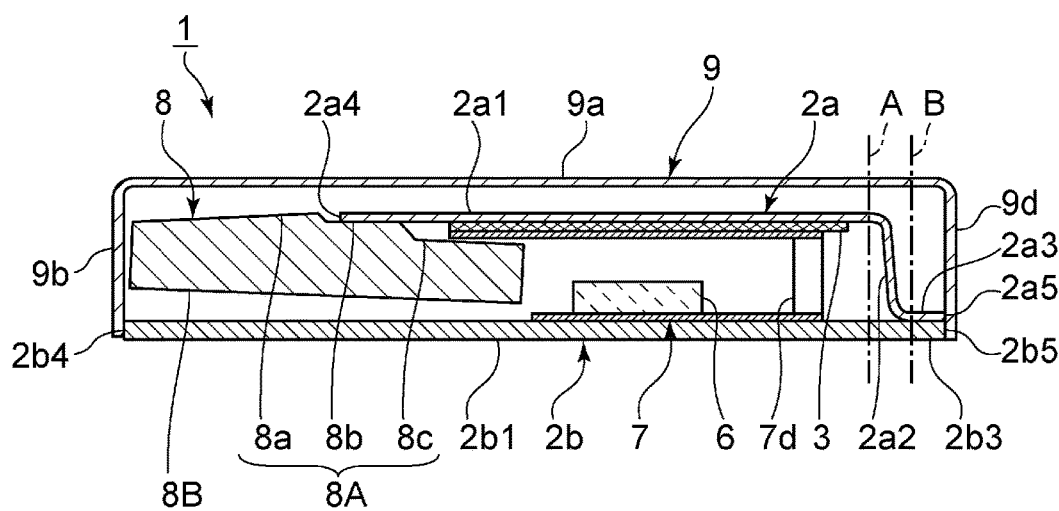
FIG. 2 is a side sectional view of the vibration device according to the first exemplary embodiment.
Figure 3:
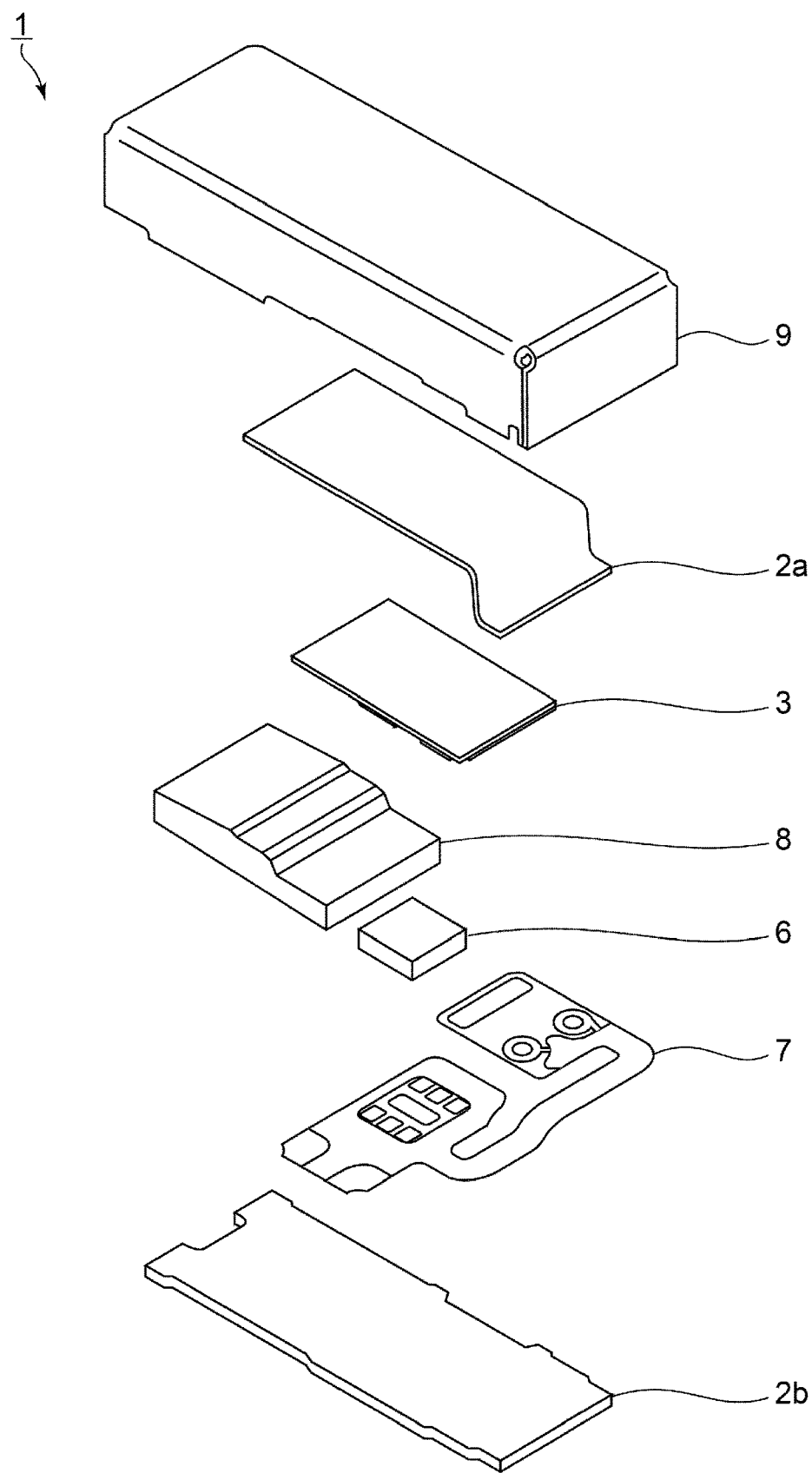
FIG. 3 is an exploded perspective view of the vibration device according to the first exemplary embodiment.

FIG. 1 is a perspective view showing the exterior of a vibration device according to a first exemplary embodiment. FIG. 2 is a side sectional view of the vibration device according to the first exemplary embodiment. FIG. 3 is an exploded perspective view of the vibration device according to the first exemplary embodiment.

In general, the vibration device 1 shown in FIG. 1 to FIG. 3 can be used for a vibration notifying function of a portable electronic device, for example. As shown in FIG. 2, the vibration device 1 includes a first elastic plate 2a. The first elastic plate 2a includes first and second end portions 2a4 and 2a5, which are also referred to as "ends" of the first elastic plate 2a. In this embodiment, in plan view, the direction connecting the first end portion 2a4 and the second end portion 2a5 is the longitudinal direction of the first elastic plate 2a relative to vibration device 1.

Furthermore, the vibration device 1 includes a second elastic plate 2b connected to the second end portion 2a5 side of the first elastic plate 2a. The second elastic plate 2b includes third and fourth end portions 2b4 and 2b5, which are also referred to as "ends" of the second elastic plate 2b. The second elastic plate 2b includes a second joining section 2b3 located on the fourth end portion 2b5 side. The second elastic plate 2b is connected to the first elastic plate 2a in the second joining section 2b3. In this embodiment, the direction connecting the third end portion 2b4 and the fourth end portion 2b5 is the longitudinal direction of the second elastic plate 2b relative to vibration device 1. It is noted that the longitudinal directions in the first and second elastic plates 2a and 2b are not limited to the above description.

According to the exemplary embodiment, the second elastic plate 2b has a thickness that is larger than the thickness of the first elastic plate 2a. Further, the material of the second elastic plate 2b has a flexural rigidity that is higher than the flexural rigidity of the material of the first elastic plate 2a. Consequently, the second elastic plate 2b has flexural rigidity higher than the flexural rigidity of the first elastic plate 2a. Moreover, it should be appreciated that "flexural rigidity" refers to a characteristic indicating difficulty of flexural deformation of an object at the time when force is applied to the object. Thus, high flexural rigidity means that the object is less easily flexurally deformed, such that the second elastic plate 2b is less easily deformed than the first elastic plate 2 according to the exemplary embodiment.

More specifically, the first elastic plate 2a is made of SUS304 and the second elastic plate 2b is made of SUS301 according to one exemplary embodiment. It is noted that the first and second elastic plates 2a and 2b may be made of another material having elasticity such as metal other than the above or synthetic resin. However, as in this embodiment, the first and second elastic plates 2a and 2b are desirably made of metal such as stainless steel. Consequently, it is possible to further prevent a decrease in the strength of vibration in the first and second elastic plates 2a and 2b.

In another embodiment, the first and second elastic plates 2a and 2b may be made of the same material. In this case, it is possible to set the flexural rigidity of the second elastic plate 2b higher than the elastic rigidity of the first elastic plate 2a by differentiating thicknesses or the like. Alternatively, the thicknesses of the first and second elastic plates 2a and 2b may be the same. In this case, it is possible to set the flexural rigidity of the second elastic plate 2b higher than the flexural rigidity of the first elastic plate 2a by using different materials or the like.

In any event, the first elastic plate 2a includes a first planar section 2a1, a first linking section 2a2, and a first joining section 2a3 located between the first and second end portions 2a4 and 2a5. The first planar section 2a1 has a planar shape. The distal end portion of the first planar section 2a1 is located at the first end portion 2a4. The first linking section 2a2 connects the first planar section 2a1 and the first joining section 2a3. The first joining section 2a3 is joined to the second elastic plate 2b. The distal end portion of the first joining section 2a3 is located at the second end portion 2a5.

On the other hand, the second elastic plate 2b includes a second planar section 2b1 and the second joining section 2b3 located between the third and fourth end portions 2b4 and 2b5. The second planar section 2b1 also has a planar shape. The second planar section 2b1 of the second elastic plate 2b is opposed to the first planar section 2a1 of the first elastic plate 2a. The second joining section 2b3 is joined to the first joining section 2a3 of the first elastic plate 2a.

According to the exemplary embodiment, the first elastic plate 2a is bent to the second elastic plate 2b side in the first linking section 2a2. The first joining section 2a3 extends from the first linking section 2a2 in a direction away from the first end portion 2a4. The first joining section 2a3 includes a surface extending in parallel to the second planar section 2b1 of the second elastic plate 2b. The first joining section 2a3 is joined to the second elastic plate 2b on the surface. The first elastic plate 2a and the second elastic plate 2b are desirably joined by welding. Consequently, it is possible to effectively increase joining strength.

The welding can be performed by, for example, irradiation of laser light. However, it is noted that the joining of the first and second elastic plates 2a and 2b is not limited to the above description. The joining may be achieved by, for example, a brazing metal or an adhesive in alternative embodiments.

As further shown in FIG. 2, the first linking section 2a2 is located between an alternate long and short dash line A and an alternate long and short dash line B. as further shown, both end portions of the first linking section 2a2 are bent. It is noted that at least one of both the end portions of the first linking section 2a2 may be bent to have a corner portion.

Furthermore, a piezoelectric vibrating element 3 is provided in the first planar section 2a1 of the first elastic plate 2a. More specifically, the piezoelectric vibrating element 3 is provided on a surface on the second elastic plate 2b side (i.e., facing the second elastic plate 2b) in the first planar section 2a1. Preferably, the piezoelectric vibrating element 3 is fixed to the first elastic plate 2a using an appropriate adhesive such as a thermosetting resin adhesive. Moreover, the piezoelectric vibrating element 3 preferably has a rectangular tabular shape.

Figure 4A:
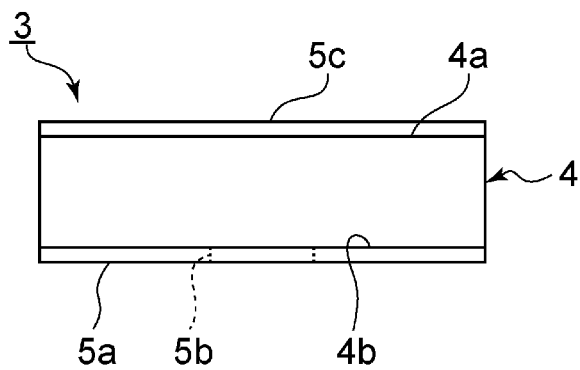
FIG. 4(a) is a side view of a piezoelectric vibrating element of the first exemplary embodiment.
Figure 4B:
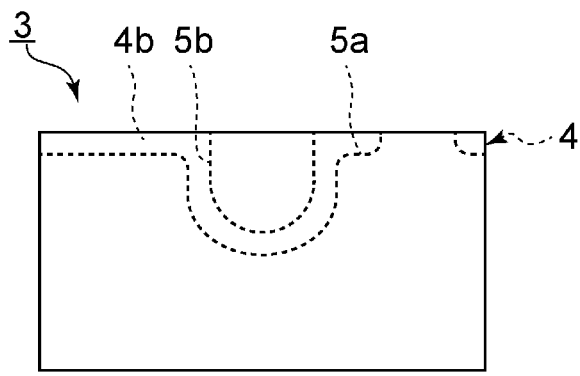
FIG. 4(b) is a plan view of the piezoelectric vibrating element in the first exemplary embodiment.

FIG. 4(a) is a side view of the piezoelectric vibrating element in the first exemplary embodiment. FIG. 4(b) is a plan view of the piezoelectric vibrating element in the first exemplary embodiment.

As shown in FIG. 4(a), the piezoelectric vibrating element 3 includes a piezoelectric layer 4. The piezoelectric layer 4 includes a first principal plane 4a and a second principal plane 4b opposed to the first principal plane 4a. The piezoelectric vibrating element 3 is fixed to the first elastic plate from the first principal plane 4a side.

As indicated by a broken line in FIG. 4(b), a first electrode 5a and a second electrode 5b are provided on the second principal plane 4b of the piezoelectric layer 4. As further shown in FIG. 4(a), a third electrode 5c is provided on the first principal plane 4a to be opposed to the first electrode 5a with the piezoelectric layer 4 interposed therebetween. Moreover, the third electrode 5c is electrically connected to the second electrode 5b by a via hole electrode or by a connection electrode (not shown in the figure) through a side surface of the piezoelectric layer 4.

In an exemplary aspect, appropriate piezoelectric ceramics such as PZT ceramics can be used as the material for the piezoelectric layer 4. Moreover, the first to third electrodes 5a to 5c are preferably made of appropriate metal or alloy. However, it should be appreciated that this configuration of the piezoelectric vibrating element 3 is not particularly limited.

During operation, an AC electric field is applied between the first and third electrodes 5a and 5c of the piezoelectric vibrating element 3, whereby the piezoelectric vibrating element 3 expands and contracts in the in-plane direction. When the piezoelectric vibrating element 3 expands and contracts, a warp occurs in the first elastic plate 2a shown in FIG. 2. According to the occurrence of the warp, the first elastic plate 2a repeats a state in which the first end portion 2a4 is displaced downward in FIG. 2 and a state in which the first end portion 2a4 is displaced upward and vibrates. The vibration of the first elastic plate 2a is propagated to the second elastic plate 2b via the first joining section 2a3. The vibration device 1 is mounted from the second elastic plate 2b side. Vibration of the vibration device 1 is propagated from the second elastic plate 2b to the outside. Consequently, the vibration notifying function by vibration of the vibration device 1 is achieved.

According to the exemplary embodiment, the vibration device 1 includes the first elastic plate 2a on which the piezoelectric vibrating element 3 is provided and the second elastic plate 2b joined to the first elastic plate 2a, with the second elastic plate 2b having a flexural rigidity that is higher than the flexural rigidity of the first elastic plate 2a. Consequently, a decrease in the vibration strength of the second elastic plate 2b can be minimized even while the thickness and the size of the vibration device 1 are reduced. Therefore, it is possible to efficiently propagate the vibration from the second elastic plate 2b to the outside. The details of this configuration will become readily apparent from the description below.

As shown in FIG. 2 and FIG. 3, a circuit board 6 functioning as a driving circuit section is disposed in the second planar section 2b1 of the second elastic plate 2b. More specifically, the circuit board 6 is provided on a surface on the first elastic plate 2a side in the second planar section 2b1.

A glass epoxy board or an appropriate board material made of synthetic resin such as polyimide can be used for the circuit board 6 according to an exemplary embodiment. At least a part of a driving circuit for feeding electric power to the piezoelectric vibrating element 3 and driving the piezoelectric vibrating element 3 is formed on the circuit board 6.

Moreover, the circuit board 6 is electrically connected to the piezoelectric vibrating element 3 by a flexible printed wiring board 7. The flexible printed wiring board 7 is configured using a resin film having flexibility such as thermosetting polyimide. A conductive adhesive, solder, and the like can be used for connection of the circuit board 6 and the piezoelectric vibrating element 3 to the flexible printed wiring board 7.

Figure 5:
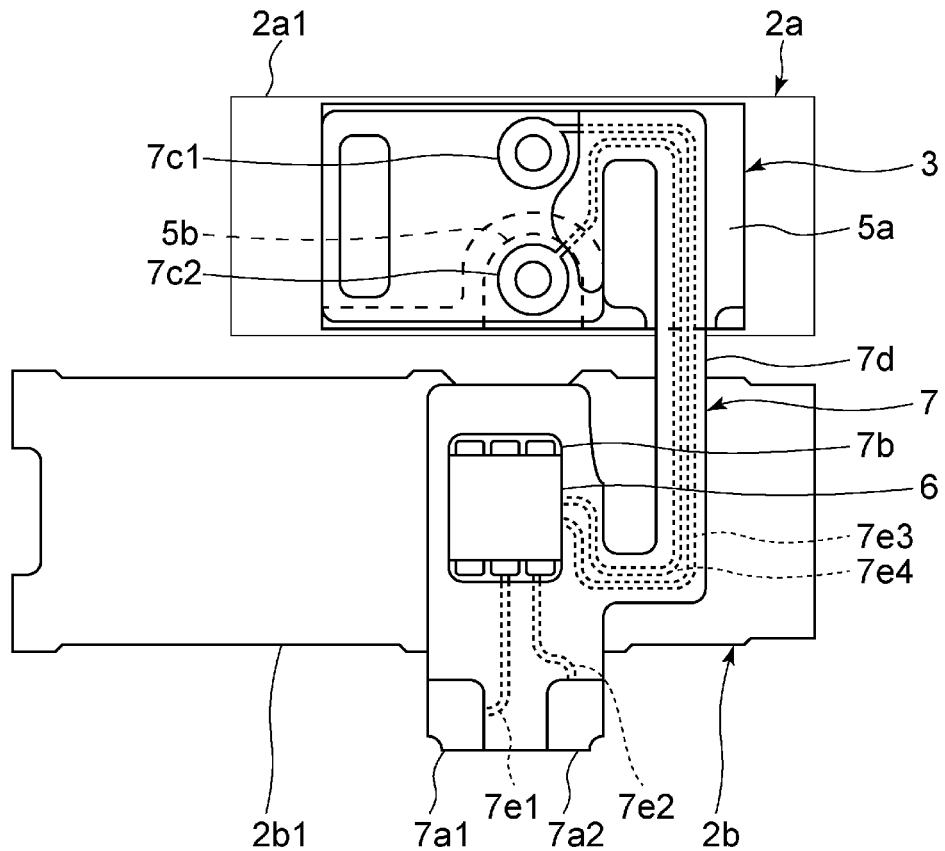
FIG. 5 is a plan view showing, in an exploded state, the piezoelectric vibrating element, a circuit board, and a flexible printed wiring board in the first exemplary embodiment.

FIG. 5 is a plan view showing, in an exploded state, the piezoelectric vibrating element, the circuit board, and the flexible printed wiring board for demonstrating the connection state of the piezoelectric vibrating element and the circuit board in the first exemplary embodiment.

As shown, the flexible printed wiring board 7 includes first electric connecting sections 7a1 and 7a2, a second electric connecting section 7b, third electric connecting sections 7c1 and 7c2, and a wire linking section 7d. The first electric connecting sections 7a1 and 7a2 are connected to the outside as also shown in FIG. 1. Moreover, the first electric connecting section 7a1 and the first electric connecting section 7a2 are connected to different potentials as should be appreciated to one skilled in the art. Furthermore, the first electric connecting sections 7a1 and 7a2 are electrically connected to the second electric connecting section 7b by wires 7e1 and 7e2.

The circuit board 6 is placed on the second electric connecting section 7b. The second electric connecting section 7b and the circuit board 6 are electrically connected. The second electric connecting section 7b is electrically connected to the third electric connecting sections 7c1 and 7c2 by wires 7e3 and 7e4 that pass through the wire linking section 7d.

Moreover, the third electric connecting sections 7c1 and 7c2 are connected to the piezoelectric vibrating element 3. More specifically, the third electric connecting section 7c1 is connected to the first electrode 5a of the piezoelectric vibrating element 3. The third electric connecting section 7c2 is connected to the second electrode 5b of the piezoelectric vibrating element 3.

As shown in FIG. 2, the flexible printed wiring board 7 is fixed to a surface on the first elastic plate 2a side in the second planar section 2b1 of the second elastic plate 2b. In one exemplary aspect, the fixing can be performed using an appropriate adhesive or an appropriate adhesive sheet. Moreover, the wire linking section 7d is bent such that the second electric connecting section is disposed on the second elastic plate 2b and the third electric connecting section is disposed on the first elastic plate 2a.

In manufacturing of the vibration device 1, electric connection work can be performed in a state in which the piezoelectric vibrating element 3, the circuit board 6, and the flexible printed wiring board 7 are developed as shown in FIG. 5. Therefore, it is possible to easily perform the electric connection work.

It is noted that the circuit section is not limited to the circuit board described herein. The circuit section only has to form at least a part of a circuit for driving the piezoelectric vibrating element 3. For example, the circuit section may be formed by a wiring element. The configuration of connection of the circuit section and the piezoelectric vibrating element 3 is not particularly limited either. The circuit section and the piezoelectric vibrating element 3 may be connected by a lead wire or the like.

As further shown in FIG. 1, the first electric connecting sections 7a1 and 7a2 of the flexible printed wiring board 7 further protrude sideward from the second elastic plate 2b and a package member 9 explained below. Therefore, it is possible to easily provide electric connection to the outside.

As shown in FIG. 2, a mass adding member 8 (i.e., a weight or vibration weight) is attached to the first end portion 2a4 of the first elastic plate 2a. A resonance frequency of the vibration device 1 can be adjusted by the mass adding member 8. By adding the mass adding member 8, it is possible to increase a distal end mass of a pendulum formed by the first elastic plate 2a and increase the vibration of the vibration device 1. The mass adding member 8 can be made of appropriate metal, a combined material of metal and resin, ceramics, or the like. Preferably, the mass adding member 8 is formed of metal having high density such as tungsten because mass adding action is high.

The mass adding member 8 includes a first principal plane 8A located on the first elastic plate 2a side (i.e., facing the first elastic plate 2a) and a second principal plane 8B located on the second elastic plate 2b side (i.e., facing the second elastic plate 2b).

Moreover, the first principal plane 8A of the mass adding member 8 preferably has a step-wise shape. More specifically, the first principal plane 8A includes a third planar section 8a, a fourth planar section 8b, and a fifth planar section 8c linked via steps. The height of the step between the third planar section 8a and the fourth planar section 8b is set equal to the thickness of the first elastic plate 2a in an exemplary aspect.

The first end portion 2a4 of the first elastic plate 2a is provided in the fourth planar section 8b. More specifically, the first end portion 2a4 of the first elastic plate 2a is disposed near the step. The vicinity of the first end portion 2a4 is placed in the fourth planar section 8b.

The fourth planar section 8b and the fifth planar section 8c are also linked via another step. The distal end portion of the piezoelectric vibrating element 3 is disposed near the step. In this embodiment, the distal end portion of a portion disposed on the first elastic plate 2a side in the flexible printed wiring board 7 reaches the distal end portion. The height of the other step is set equal to or larger than a total of the thicknesses of the piezoelectric vibrating element 3 and the flexible printed wiring board 7. Therefore, the thicknesses of the first elastic plate 2a, the piezoelectric vibrating element 3, and the flexible printed wiring board 7 are absorbed within the total dimension of the heights of the steps and the other step. Therefore, it is possible to fix the mass adding member 8 to the first end portion 2a4 of the first elastic plate 2a without causing an increase in size.

It is noted that the flexible printed wiring board 7 does not have to reach a position overlapping the mass adding member 8 in plan view. In this case, the height of the other step of the mass adding member 8 is desirably equal to or larger than the thickness of the piezoelectric vibrating element 3.

Moreover, the third planar section 8a is preferably formed as an inclined surface. At least a part of the second principal plane 8B is also preferably an inclined surface. Consequently, the thickness of the mass adding member 8 (the distance between the first principal plane 8A of the mass adding member 8 and the second principal plane 8B of the mass adding member 8) decreases further away (i.e., tapers) from the first end portion 2a4 of the first elastic plate 2a. Consequently, during vibration of the first elastic plate 2a, the mass adding member 8 less easily collides with the second elastic plate 2b and a top plate section 9a of a package member 9 explained below. Therefore, it is possible to more efficiently propagate the vibration to the outside.

It is noted that the shape of the mass adding member 8 can be modified according to alternative embodiments and should not be limited to the design shown in FIG. 2.

In addition, the vibration device 1 includes a package member 9 functioning as a cover member. The package member 9 is provided to house the first elastic plate 2a to which the piezoelectric vibrating element 3 and the mass adding member 8 are attached.

As shown in FIG. 1, the package member 9 includes a top plate section 9a and first to fourth side surface sections 9b to 9e, first ends of which are linked to the top plate section 9a. The first and third side surface sections 9b and 9d are opposed to each other. The second and fourth side surface sections 9c and 9e are also opposed to each other.

The first side surface section 9b is located on the first end portion 2a4 side of the first elastic plate 2a. The third side surface section 9d is located on the second end portion 2a5 side. It is noted that the package member 9 does not have to include at least one of the first and third side surface sections 9b and 9d. However, when the package member 9 includes the first and third side surface sections 9b and 9d, it is possible to effectively increase the strength of the vibration device 1.

Moreover, the package member 9 is made of appropriate metal or synthetic resin. The package member 9 is desirably made of metal because the metal is excellent in mechanical strength. The package member 9 is more desirably made of stainless steel because the stainless steel is excellent in rust prevention.

As explained above, in this embodiment, the second elastic plate 2b has the flexural rigidity higher than the flexural rigidity of the first elastic plate 2a. Consequently, the thickness and the size of the vibration device 1 can be reduced with less reduction ins vibration strength compared with conventional designs. This technical result is explained with reference to FIG. 6 below.

Figure 6:
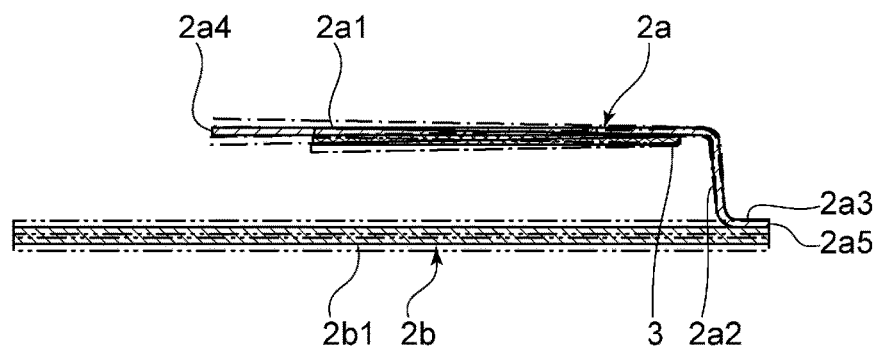
FIG. 6 is a schematic diagram illustrating vibration of first and second elastic plates in the first exemplary embodiment.

In particular, FIG. 6 is a schematic diagram of a side cross section for explaining vibration of the first and second elastic plates in the first exemplary embodiment.

By applying an AC electric field to the piezoelectric vibrating element 3, as indicated by an alternate long and short dash line in FIG. 6, the first elastic plate 2a repeats a state in which the first end portion 2a4 is displaced downward in FIG. 6 and a state in which the first end portion 2a4 is displaced upward and vibrates. The vibration is propagated from the first joining section 2a3 to the second elastic plate 2b. Since the second elastic plate 2b has the flexural rigidity of higher than the flexural rigidity of the first elastic plate 2a, the second elastic plate 2b is less easily bent by the vibration. Therefore, as indicated by an alternate long and two short dashes line in FIG. 6, the entire second elastic plate 2b vibrates up and down. Therefore, the strength of the vibration propagated to the second elastic plate 2b is less easily attenuated. Therefore, even if a reduction in thickness and size is promoted, a decrease in the strength of vibration less easily occurs.

Further, as shown in FIG. 2, the package member 9 is not provided on a side where the vibration device 1 is mounted in the second elastic plate 2b. The vibration device 1 is mounted such that the second elastic plate 2b is in contact with a target to which the vibration is propagated. Therefore, it is possible to more efficiently propagate the vibration to the outside.

In the second elastic plate 2b, bending due to the vibration propagated from the first elastic plate 2a less easily occurs.

Therefore, in the mounting of the vibration device 1, for example, a double-sided adhesive tape that is easily deformed and less easily prevents bending of the second elastic plate 2b can also be used. Even if the double-side adhesive tape or the like is used, deterioration in propagation efficiency of vibration is less easily caused. It is possible easily mount the vibration device 1.

A portion where the first elastic plate 2a and the second elastic plate 2b are joined desirably includes at least one of the second end portion 2a5 of the first elastic plate 2a and the fourth end portion 2b5 of the second elastic plate 2b. Consequently, it is possible to promote a reduction in the size of the vibration device 1. However, more desirably, as in this embodiment, the portion where the first and second elastic plates 2a and 2b are joined desirably includes both of the second and fourth end portions 2a5 and 2b5. Consequently, it is possible to further promote a reduction in the size of the vibration device 1.

In FIG. 7 to FIG. 10 and FIG. 11(a) and FIG. 11(b) referred to below, vibration devices according to second to sixth exemplary embodiments having the configurations of the first and second elastic plates different from the configuration in the first exemplary embodiment are shown. In the vibration devices according to the second to sixth embodiments, like the vibration device 1 in the first embodiment, a decrease in the strength of vibration can be minimized whether the thickness and size of the vibration device is decreased. It is noted that, in FIG. 7 to FIG. 10 and FIG. 11(a) and FIG. 11(b), only the configurations of the first and second elastic plates of the vibration device are shown, but that each exemplary vibration device can include the other components described above with respect to the first exemplary embodiment.

Figure 7:
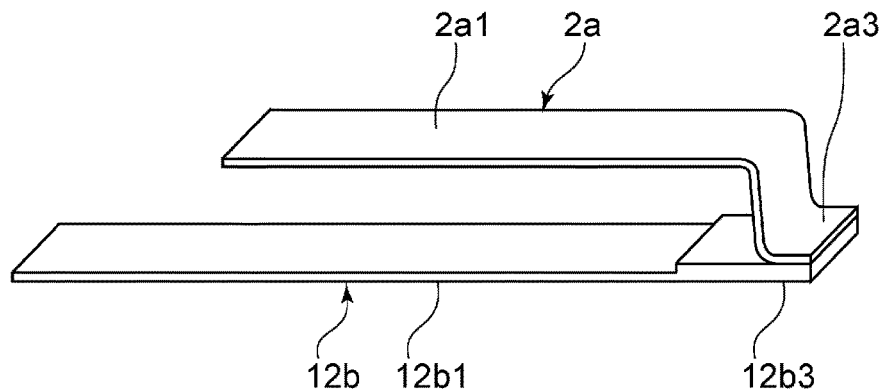
FIG. 7 is a perspective view of first and second elastic plates in a second exemplary embodiment.

FIG. 7 is a perspective view of first and second elastic plates in a second exemplary embodiment.

The second exemplary embodiment is different from the first embodiment in that the thickness of a second planar section 12b1 of a second elastic plate 12b is smaller than the thickness of a second joining section 12b3.

The thickness of the second joining section 12b3 of the second elastic plate 12b is larger than the thickness of the first elastic plate 2a. Therefore, the second elastic plate 12b less easily bends, and, thus, a decrease in the strength of vibration less easily occurs.

Since the thickness of the second planar section 12b1 is smaller than the thickness of the second joining section 12b3, in vibration, the mass adding member (i.e., the weight 8) much less easily collides with the second elastic plate 12b. Therefore, a decrease in the strength of vibration can be minimized even in view of a reduction in size and thickness of the vibration device.

Figure 8:
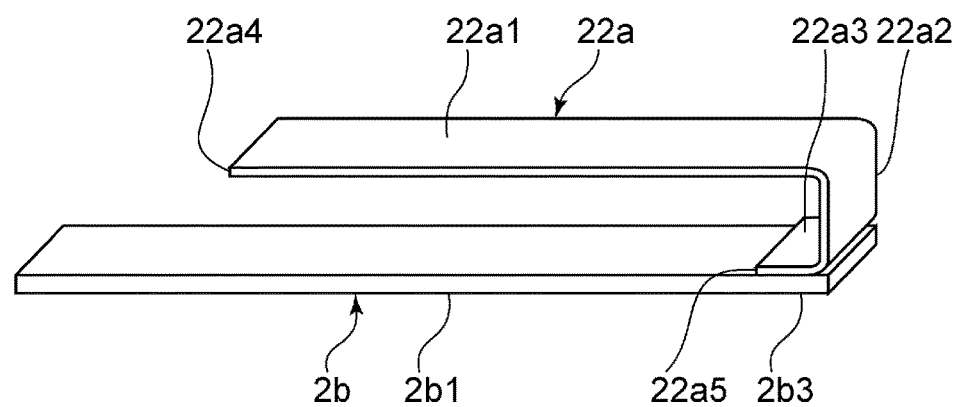
FIG. 8 is a perspective view of first and second elastic plates in a third exemplary embodiment.

FIG. 8 is a perspective view of first and second elastic plates in a third exemplary embodiment.

The third exemplary is different from the first embodiment in that, in a first elastic plate 22a, a first joining section 22a3 extends from a first linking section 22a2 in a direction approaching a first end portion 22a4 of the first elastic plate 22a.

More specifically, the first joining section 22a3 includes a surface extending in parallel to the second planar section 2b1 of the second elastic plate 2b. The first joining section 22a3 is joined to the second elastic plate 2b on the surface.

The first joining section 22a3 includes a portion overlapping a first planar section 22a1 in plan view. Therefore, it is possible to promote a reduction in the size of the vibration device.

Figure 9:
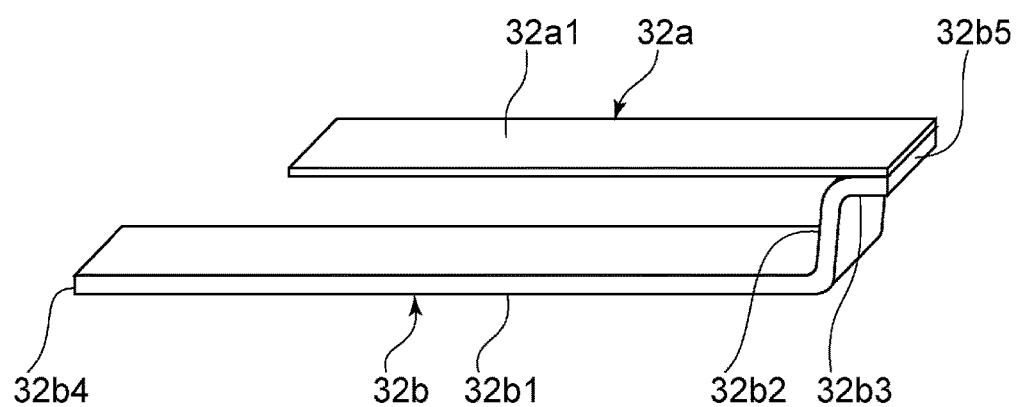
FIG. 9 is a perspective view of first and second elastic plates in a fourth exemplary embodiment.

FIG. 9 is a perspective view of first and second elastic plates in a fourth exemplary embodiment.

The fourth exemplary embodiment is different from the first embodiment in that a first elastic plate 32a is flat and that a second elastic plate 32b includes a portion bent to the first elastic plate 32a side.

More specifically, the second elastic plate 32b includes a second linking section 32b2 that links a second planar section 32b1 and a second joining section 32b3. The second joining section 32b3 is located farther on a fourth end portion 32b5 side than the second linking section 32b2 (i.e., it extends in a direction away from end 32b4).

As further shown, the second elastic plate 32b is bent to the first elastic plate 32a side in the second linking section 32b2. The second joining section 32b3 extends from the second linking section 32b2 in a direction away from a third end portion 32b4. The second joining section 32b3 includes a surface extending in parallel to a first planar section 32a1 of the first elastic plate 32a. The second joining section 32b3 is joined to the first elastic plate 32a on the surface.

It is noted that the second joining section 32b3 may extend from the second linking section 32b2 in a direction approaching the third end portion 32b4 in an alternative embodiment.

Figure 10:
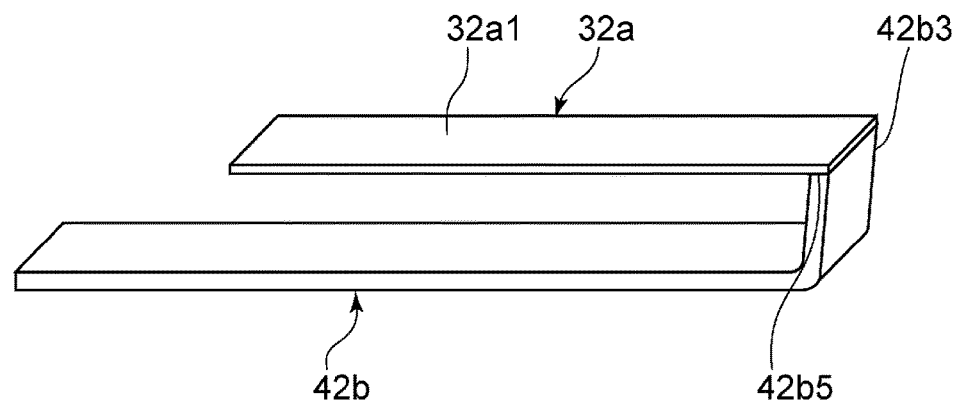
FIG. 10 is a perspective view of first and second elastic plates in a fifth exemplary embodiment.

FIG. 10 is a perspective view of first and second elastic plates in a fifth exemplary embodiment.

The fifth exemplary embodiment is different from the fourth embodiment in that a second joining section 42b3 of a second elastic plate 42b extends toward the first elastic plate 32a side. The second joining section 42b3 includes a fourth end portion 42b5. The fourth end portion 42b5 includes an end face of the second elastic plate 42b. The second joining section 42b3 is joined to the first elastic plate 32a on the end face.

In this embodiment, it is possible to reduce a contact area of the first elastic plate 32a and the second elastic plate 42b. Therefore, it is possible to promote a reduction in the size of the vibration device.

It is noted that the second elastic plate may be flat, the first joining section of the first elastic plate may extend toward the second elastic plate, and the first elastic plate may be joined to the second elastic plate on the end face on the second end portion side.

Figure 11A:
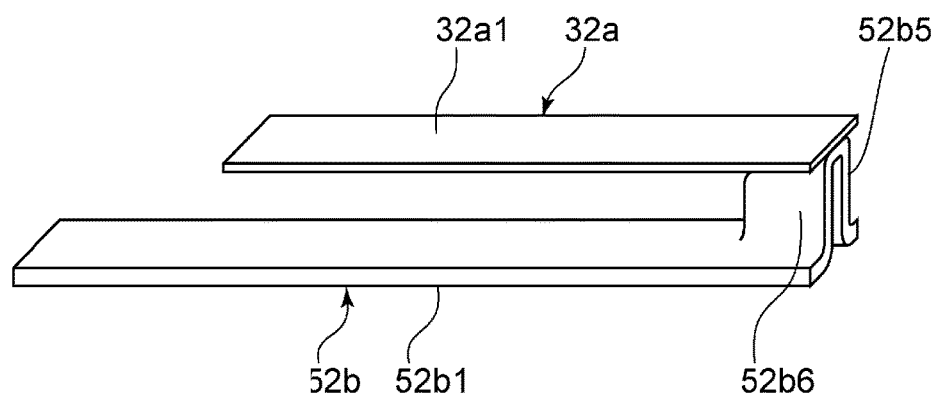
FIG. 11(a) is a perspective view of first and second elastic plates in a sixth exemplary embodiment.
Figure 11B:
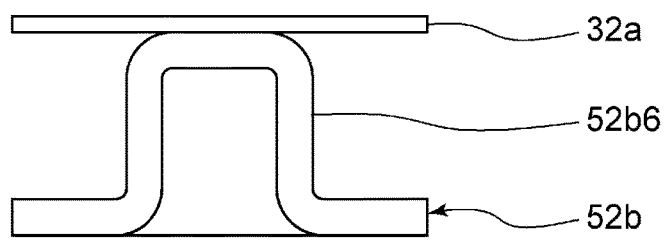
FIG. 11(b) is a rear view of the first and second elastic plates in the sixth exemplary embodiment.

FIG. 11(a) is a perspective view of first and second elastic plates in a sixth exemplary embodiment. FIG. 11(b) is a rear view of the first and second elastic plates in the sixth exemplary embodiment.

As shown in FIG. 11(a), the sixth exemplary embodiment is different from the fourth embodiment in that a second elastic plate 52b includes a projecting section 52b6 projecting to the first elastic plate 32a side on a fourth end portion 52b5 side. As shown, the second elastic plate 52b is joined to the first elastic plate 32a by the projecting section 52b6.

More specifically, the projecting section 52b6 includes a surface extending in parallel to the first planar section 32a1 of the first elastic plate 32a. The projecting section 52b6 is joined to the first elastic plate 32a on the surface.

The projecting section 52b6 is formed by bending the fourth end portion 52b5 side of the second elastic plate 52b in a U-shaped configuration, for example. As shown in FIG. 11(b), a portion where the projecting section 52b6 is formed is a concave section (e.g., U shaped) that is opened to a surface on the opposite side of the first elastic plate 32a side of the second elastic plate 52b. Preferably, the thickness of the second elastic plate 52b in the projecting section 52b6 is the same thickness as the thickness of a second planar section 52b1 shown in FIG. 11(a). It is noted that the thickness of the second elastic plate 52b in the projecting section 52b6 only has to be the same thickness as the thickness of at least a part other than the projecting section 52b6 in the second elastic plate 52b.

According to the exemplary embodiment, the vibration device is mounted from a lower surface in FIG. 11(a) of the second elastic plate 52b. At this point, a portion other than the projecting section 52b6 of the surface in the second elastic plate 52b can be brought into contact with a target on which the vibration device is mounted. Therefore, it is possible to increase an area of the second elastic plate 52b in contact with the target on which the vibration device is mounted. Therefore, it is possible to efficiently propagate vibration to the outside.

The projecting section 52b6 desirably includes the fourth end portion 52b5. Consequently, it is possible to include the fourth end portion 52b5 in a portion where the second elastic plate 52b joints with the first elastic plate 32a. Therefore, it is possible to promote a reduction in the size of the vibration device.

REFERENCE SIGNS LIST 1 vibration device
2a first elastic plate
2a1 first planar section
2a2 first linking section
2a3 first joining section
2a4, 2a5 first and second end portions
2b second elastic plate
2b1 second planar section
2b3 second joining section
2b4, 2b5 third and fourth end portions
3 piezoelectric vibrating element
4 piezoelectric layer
4a, 4b first and second principal planes
5a to 5c first to third electrodes
6 circuit board
7 flexible printed wiring board
7a1, 7a2 first electric connecting sections
7b second electric connecting section
7c1, 7c2 third electric connecting sections
7d wire linking section
7e1 to 7e4 wires
8 mass adding member
8A, 8B first and second principal planes
8a to 8c third to fifth planar sections
9 package member
9a top plate section
9b to 9e first to fourth side surface sections
12b second elastic plate
12b1 second planar section
12b3 second joining section
22a first elastic plate
22a1 first planar section
22a2 first linking section
22a3 first joining section
22a4, 22a5 first and second end portions
32a first elastic plate
32a1 first planar section
32b second elastic plate
32b1 second planar section
32b2 second linking section
32b3 second joining section
32b4, 32b5 third and fourth end portions
42b second elastic plate
42b3 second joining section 42b5 fourth end portion
52b second elastic plate
52b1 second planar section
52b5 fourth end portion
52b6 projecting section

The invention claimed is:

1. A vibration device comprising:
a first elastic plate that includes first and second ends and a first planar section disposed between the first and second ends;
a second elastic plate coupled to the second end of the first elastic plate and that includes a second planar section opposing the first planar section of the first elastic plate, the second elastic plate having a flexural rigidity higher than a flexural rigidity of the first elastic plate;
a piezoelectric vibrating element disposed on a surface on at least a portion of the first planar section of the first elastic plate and facing the second elastic plate; and
a weight coupled to the first end of the first elastic plate.

2. The vibration device according to claim 1, further comprising a package member configured to house the first elastic plate, the piezoelectric vibrating element, and the weight.

3. The vibration device according to claim 1, further comprising a circuit board disposed on a surface on the second planar section of the second elastic plate and facing the first elastic plate, wherein the circuit board comprises at least a part of a circuit configured to drive the piezoelectric vibrating element.

4. The vibration device according to claim 1, wherein the second elastic plate has a thickness greater than a thickness of the first elastic plate, such that the second elastic plate has a flexural rigidity higher than the flexural rigidity of the first elastic plate.

5. The vibration device according to claim 1, wherein the second elastic plate comprises a material having a flexural rigidity higher than a flexural rigidity of a material of the first elastic plate.

6. The vibration device according to claim 1, wherein:
the first elastic plate includes a joining section coupled to the second elastic plate and a linking section that links the joining section and the first planar section,
the joining section is located closer to the second end of the first elastic plate than the linking section, and
the first section of the first elastic plate bends towards the second elastic plate.

7. The vibration device according to claim 6, wherein the joining section extends from the linking section in a direction away from the first end of the first elastic plate and includes a surface extending in parallel to the second planar section of the second elastic plate that is coupled to the second elastic plate.

8. The vibration device according to claim 6, wherein the joining section extends from the linking section in a direction towards the first end of the first elastic plate and includes a surface extending in parallel to the second planar section of the second elastic plate that is coupled to the second elastic plate.

9. The vibration device according to claim 1, wherein:
the second elastic plate includes third and fourth ends, a joining section in which the second elastic plate is coupled to the first elastic plate, and a linking section that links the joining section and the second planar section,
the second planar section is disposed between the third and fourth ends and the joining section is located closer to the fourth end of the second elastic plate than the linking section, and
the linking section of the second elastic plate bends towards the first elastic plate.

10. The vibration device according to claim 9, wherein the joining section extends from the linking section in a direction away from the third end of the second elastic plate and includes a surface extending in parallel to the first planar section of the first elastic plate that is coupled to the first elastic plate.

11. The vibration device according to claim 9, wherein the fourth end of the second elastic plate includes an end face that is coupled to the first elastic plate.

12. The vibration device according to claim 1, wherein the first elastic plate is planar and the second elastic plate includes a projecting section that projects towards the first elastic plate and is coupled to the second end of the first elastic plate.

13. The vibration device according to claim 12, wherein the projecting section comprises a same thickness as at least a portion of the second elastic plate other than the projecting section and the projecting section comprises a concave shape that is opened to a surface of the second elastic plate facing the first elastic plate.

14. The vibration device according to claim 1, wherein the second planar section of the second elastic plate comprises a thickness that is less than a thickness of a portion of the second elastic plate that is coupled to the first elastic plate.

15. The vibration device according to claim 1, wherein the second elastic plate includes third and fourth ends and the first elastic plate and the second elastic plate are coupled to each other at the second end of the first elastic plate and the fourth end of the second elastic plate.

16. The vibration device according to claim 1, wherein the first planar section of the first elastic plate connects the first and second ends of the first elastic plate and extends in a direction longitudinal of the first elastic plate relative to the vibration device.

17. A vibration device comprising:
a first elastic plate with opposing first and second ends and a planar section disposed therebetween;
a second elastic plate coupled to the first elastic plate and that includes a second planar section that faces the first planar section of the first elastic plate; and
a piezoelectric vibrating element disposed on the first planar section of the first elastic plate and configured to vibrate the first elastic plate upon excitation,
wherein one of the first and second elastic plates includes a linking member that extends towards the other of the first and second elastic plates and that couples the second elastic plate to the first elastic plate, and
wherein the second elastic plate has a flexural rigidity higher than a flexural rigidity of the first elastic plate, such the second elastic plate is configured to flexurally deform less than the first elastic plate upon the excitation of the piezoelectric vibrating element.

18. The vibration device according to claim 17,
wherein the second elastic plate is coupled to the second end of the first elastic plate, and
wherein the vibration device further comprises a weight coupled to the first end of the first elastic plate and having a thickness that tapers in a horizontal direction away from the first end of the first elastic plate, such that the weight is configured to vibrate in a vertical direction of the vibration device upon the excitation of the piezoelectric vibrating element without colliding into at least the second elastic plate.

19. The vibration device according to claim 17, wherein the first and second elastic plates are composed of a same material and the second elastic plate has a thickness greater than a thickness of the first elastic plate, such that the second elastic plate has a flexural rigidity higher than the flexural rigidity of the first elastic plate.

20. The vibration device according to claim 17, wherein the first and the second elastic plates have a same thickness and the second elastic plate comprises a material having a flexural rigidity higher than a flexural rigidity of a material of the first elastic plate.

* * * * *